United States Patent
Sridevan

(10) Patent No.: US 6,900,537 B2
(45) Date of Patent: May 31, 2005

(54) HIGH POWER SILICON CARBIDE AND SILICON SEMICONDUCTOR DEVICE PACKAGE

(75) Inventor: Srikant Sridevan, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 40 days.

(21) Appl. No.: 10/698,260

(22) Filed: Oct. 31, 2003

(65) Prior Publication Data

US 2004/0130021 A1 Jul. 8, 2004

Related U.S. Application Data

(60) Provisional application No. 60/423,497, filed on Oct. 31, 2002.

(51) Int. Cl.$^7$ .............................................. H01L 23/34
(52) U.S. Cl. ...................................... 257/728; 257/678
(58) Field of Search ................................ 257/728, 678, 257/77, 782, 784, 703, 697

(56) References Cited

U.S. PATENT DOCUMENTS

| | | | | |
|---|---|---|---|---|
| 5,589,695 | A | | 12/1996 | Malhi ........................... 257/77 |
| 6,169,330 | B1 | * | 1/2001 | Pankove ...................... 257/782 |
| 6,373,318 | B1 | | 4/2002 | Dohnke et al. ............. 327/427 |
| 6,503,782 | B2 | | 1/2003 | Casady et al. ............... 438/135 |
| 6,535,050 | B2 | | 3/2003 | Baudelot et al. ............. 327/430 |
| 2001/0050589 | A1 | | 12/2001 | Baudelot et al. ............. 327/430 |
| 2002/0066903 | A1 | * | 6/2002 | Parsons et al. ............... 257/77 |
| 2002/0149021 | A1 | | 10/2002 | Casady et al. ................ 257/77 |

OTHER PUBLICATIONS

"Application Example 2: Flyback Power Supply Operating from > 600 V DC<," http://www.siced.de/en/example_2.html, 1 page, downloaded Oct. 28, 2003.
"Silicon carbide moves further towards commercialization," http://www.compoundsemiconductor.net/magazine/article/8/1/7/1, 4 pages, downloaded Oct. 28, 2003.
Philip G. Neudeck, "SiC Technology," NASA Lewis Research Center, 54 pages (1998).
Werner Tursky, "Devices and their Packaging Technology," pp. 1–6, IEEE–4th Workshop Future of Electronic Power Processing and Conversion, May 27–29, 2001, Salina, Italy.

* cited by examiner

*Primary Examiner*—David Nelms
*Assistant Examiner*—Thinh T Nguyen
(74) *Attorney, Agent, or Firm*—Ostrolenk, Faber, Gerb & Soffen, LLP

(57) ABSTRACT

A silicon carbide semiconductor field effect transistor and a silicon metal oxide semiconductor field effect transistor are packaged as a hybrid field effect transistor having a high voltage resistance provided by the silicon carbide device and a low switch-on resistance provided by the silicon device. The two devices are co-packaged electrode-on-electrode. A die-on-die configuration reduces the footprint of the hybrid device, and a side-by-side configuration provides an increased area for thermal management of the hybrid device.

11 Claims, 3 Drawing Sheets

HIGH POWER SILICON CARBIDE AND SILICON SEMICONDUCTOR DEVICE PACKAGE

RELATED APPLICATION

This application claims the benefit of U.S. Provisional Application No. 60/423,497, filed Oct. 31, 2002, which is incorporated in its entirety by reference herein.

FIELD OF THE INVENTION

This invention relates to semiconductor devices and more specifically relates to a high voltage semiconductor device with low on-resistance.

BACKGROUND OF THE INVENTION

Silicon carbide (SiC) is wide band gap semiconductor ($E_G$=3.0 eV) for high-temperature, high-power and radiation hardened electronic devices. SiC can be thermally oxidized to form $SiO_2$, and the $SiC/SiO_2$ interface can be used to produce devices, such as transistors, charge-coupled devices and non-volatile memories. However, the inversion layer mobility on SiC can be low, limiting the switch-on resistance ($R_{dson}$). Further, the gate oxide in SiC is highly susceptible to dielectric breakdown due to the high electric fields in SiC.

Circuits in which a SiC device is connected in series with a silicon MOSFET are known. An example is disclosed in U.S. Pat. No. 6,373,318 to Dohnke et al. issued Apr. 16, 2002. However, the circuit of Dohnke et al. has a grid-cathode voltage of the junction field effect transistor (JFET) at a voltage less than the source voltage of the metal oxide semiconductor field effect transistor (MOSFET).

The gate drain junction of the SiC JFET of Dohnke et al. supports the high voltage. Thus, connecting the junction on the gate side and leading up the gate driver can lead to avalanche current flowing into the gate circuit when the device is in the blocking mode.

Although it has been suggested to try using an SiC device with a silicon MOSFET, practical devices are limited by packaging and thermal management consideration.

SUMMARY OF THE INVENTION

A SiC-based field effect transistor (SiCFET), such as a JFET or a metal semiconductor field effect transistor (MESFET), is co-packaged with a silicon MOSFET (hereinafter a MOSFET) to serve as a unitary high voltage, low on-resistance FET structure having a gate contact, a source contact and a drain contact. The hybrid transistor allows thermal management of the package with a single heat sink, for example.

The SiCFET and MOSFET are mounted electrode-on-electrode, sometimes termed die-on-die. By electrode-on-electrode, it is meant that at least one electrode layer of one of the dies supports an electrode of the other die. For example, a gate electrode on the bottom of a SiCFET is joined to a source electrode on the top surface of a MOSFET semiconductor die in a die-on-die configuration. By die-on-die, it is meant that at least a portion of the semiconductor die of the SiCFET is mounted over or under the semiconductor die of the MOSFET. Since a SiCFET is typically smaller than a MOSFET, the co-packaged FET may have a footprint no larger than the MOSFET. Furthermore, the source electrode of the MOSFET acts as a heat spreader for the high power SiCFET.

Alternatively, the SiCFET may be designed conventionally with the source and gate on top and the drain on the bottom of the semiconductor die. Then, the MOSFET may be mounted on the SiCFET such that the MOSFET source electrically connects with the SiCFET gate. In another alternative embodiment, the MOSFETs drain is supported by, but is electrically insulated from, the drain electrode of the SiCFET, the drain electrode of the SiCFET being extended beyond the perimeter of the SiCFET semiconductor die, acting as the drain contact of the co-packaged unitary FET and a heat sink.

One advantage of the co-packaged FET is that the SiCFET provides for faster higher power switching than a comparable MOSFET with the same voltage rating. Another advantage is the reduced complexity of thermal management. Other features and advantages of the present invention will become apparent from the following description of the invention which refers to the accompanying drawings.

DETAILED DESCRIPTION OF THE PREFERRED EMBODIMENTS

Figure 2A:
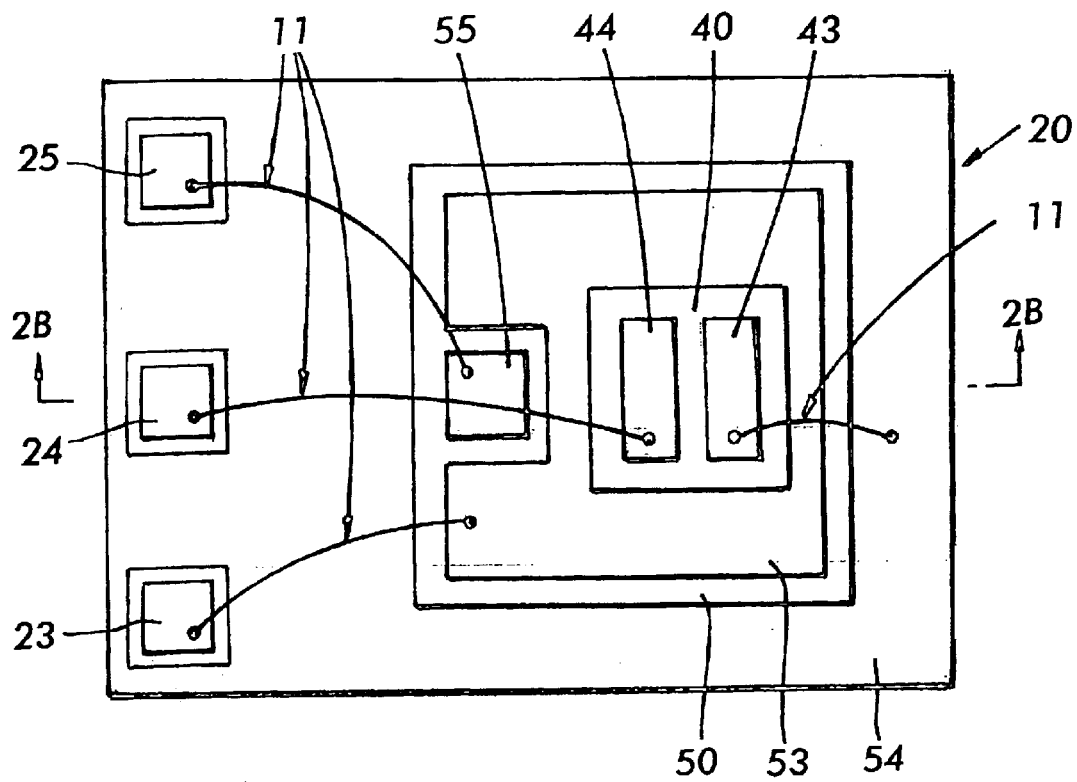
FIG. 2A shows a first embodiment of the present invention configured as one semiconductor die mounted on an electrode of a second semiconductor die.
Figure 2B:
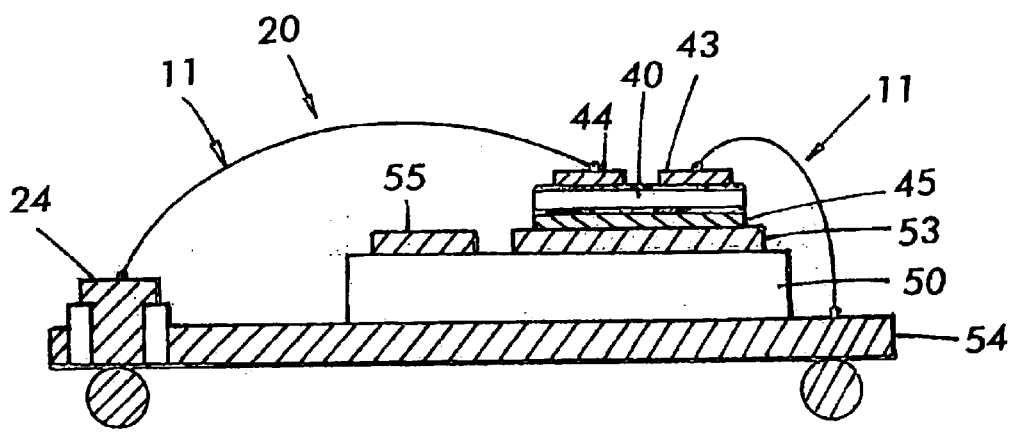
FIG. 2B shows a cross-sectional view along line A—A of FIG. 2A.

FIGS. 2A and 2B illustrate a die-on-die hybrid transistor 20 of the present invention. A SiCFET 40 is supported by a source electrode 53 of a MOSFET 50, such that an electrical connection is made between bottom gate electrode 45 of the SiCFET 40 and the source electrode 53 of the MOSFET 50. For example, the electrodes are joined using a solder. The SiCFET 40 has a source electrode 43 electrically connected to the drain electrode 54 of the MOSFET 50 and a drain electrode 44 electrically connected to the drain contact 24 located on the surface of the hybrid transistor 20. The drain contact 24, the source contact 23 and the gate contact 25 of the hybrid transistor 20 are configured to be coupled to an electronic circuit (not shown), such as a printed circuit board.

Electrode 43 is attached by wire bond 11 to the bottom drain electrode 54 of MOSFET 50. Any conventional electrical connection may be substituted for wire bonding. Also, the source electrode 53 that is in electrical contact with the gate electrode 45 of the SiCFET 40 is electrically connected by a wire bond 11 to source contact 23. For example, the hybrid transistor 20 is for use in high power electronic circuits and the source electrode 53 and the drain electrode 54 of the MOSFET 50 act as heat spreaders. Thus, mounting electrode-to-electrode provides thermal management advantages not offered by conventional packaging, while limiting the hybrid transistor footprint to that of the MOSFET 50. Also, the bottom of the drain electrode 54 may be coupled to a heat sink (not shown) to improve thermal management of the co-packaged device 20.

Figure 3:
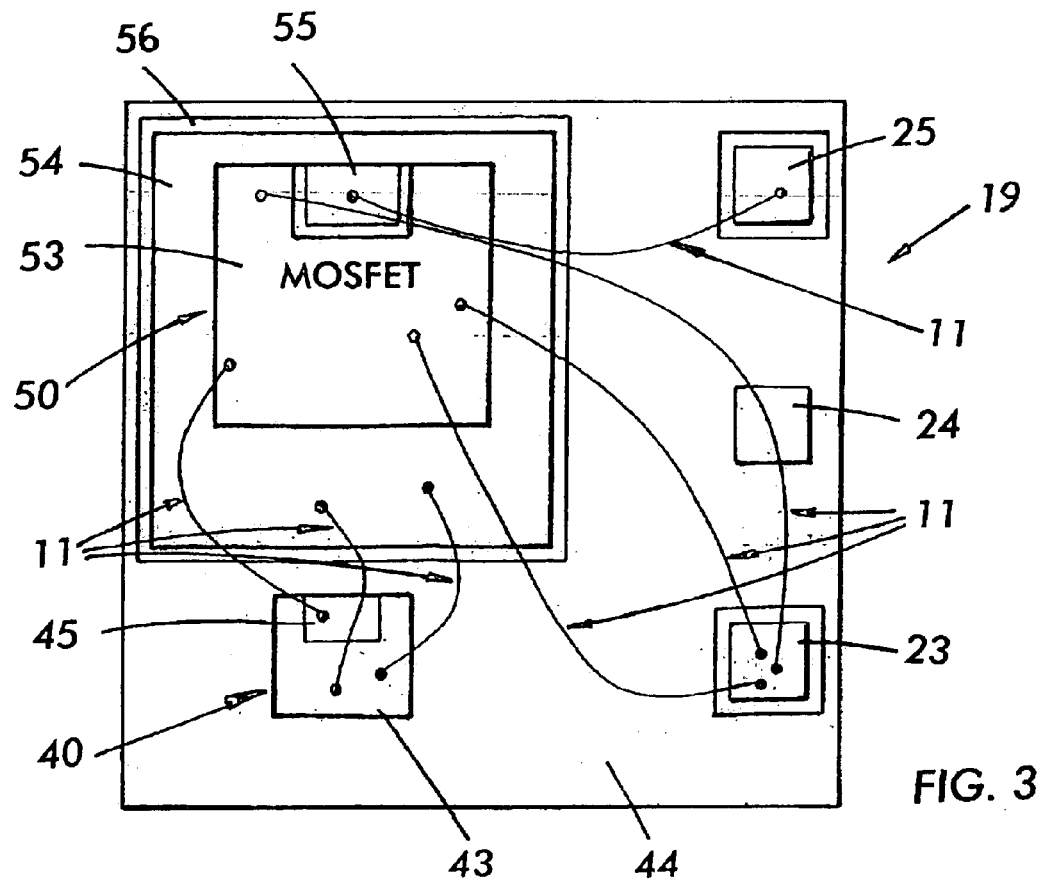
FIG. 3 shows a second embodiment of the invention, using a side-by-side mounting of the die.

FIG. 3 shows an alternative embodiment of the present invention comprising a side-by-side arrangement of semiconductor dice of a MOSFET 50 and a SiCFET 40. In the example shown, the drain electrode 54 of the MOSFET is supported by the drain electrode 44 of the SiCFET 40 and is electrically insulated by an insulating layer 56. By thermally insulating the MOSFET 50 from the SiCFET 40, higher operating temperatures of the SiCFET 40 may be used without damaging the MOSFET 50. The bottom electrode 54 of the MOSFET 50 extends beyond the perimeter of the semiconductor die and is electrically connected by a wire bond 11 to the source electrode 43 of the SiCFET 40. Thus, the electrode 54 also acts as a heat spreader for the MOSFET 50. The other electrode 45 of the SiCFET is electrically connected by a wire bond 11 to the source electrode 53 of the MOSFET 50, which is connected by at least one wire bond 11 to a first contact 23. The gate electrode 55 on the top surface of the MOSFET 50 is electrically connected by a wire bond 11 to the gate contact 25. The extended drain electrode 44 of the SiCFET serves as the drain contact 24 of the hybrid FET. The extended bottom electrode 44 of the SiCFET also provides a larger area for cooling of the package of the hybrid FET.

Figure 4A:
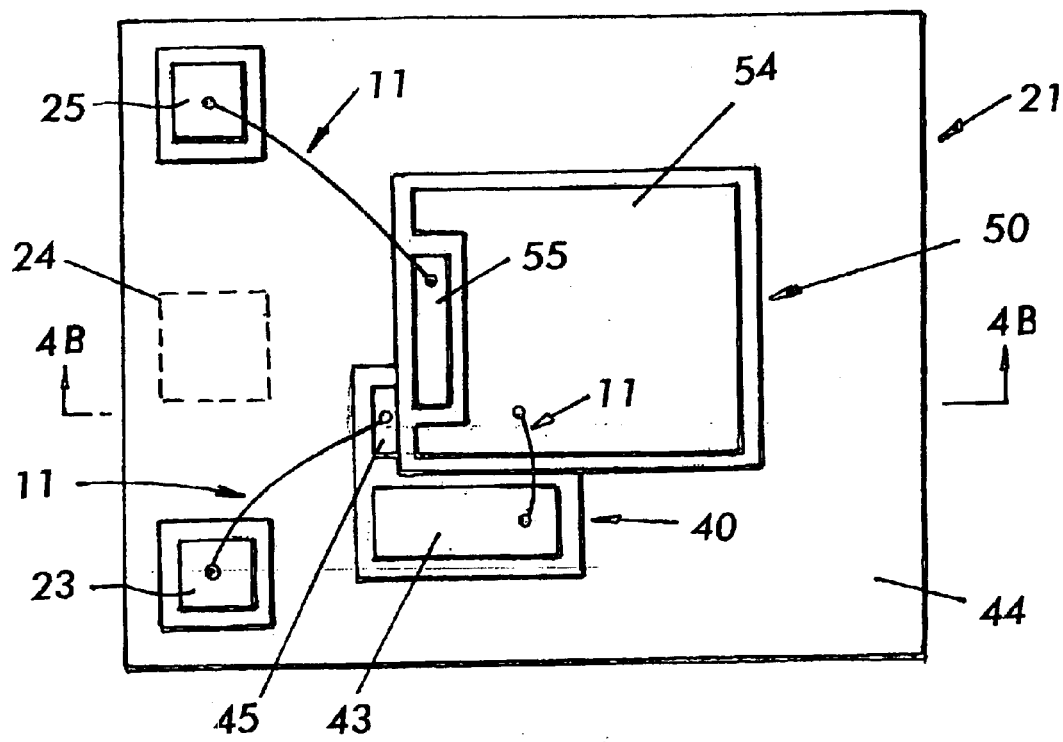
FIGS. 4A and 4B show two views of another embodiment of the present invention.
Figure 4B:
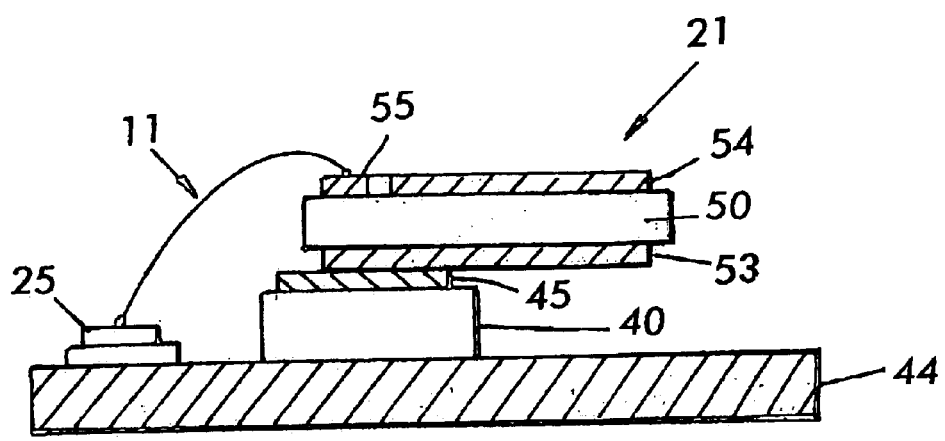

FIGS. 4A and 4B illustrate another embodiment of the present invention. An inverted MOSFET 50 is mounted on a SiCFET 40. The source electrode. 53 electrically contacts the gate electrode 45 of the SiCFET 40. The source electrode 43 of the SiCFET 40 is electrically connected by a wire bond 11 to the drain electrode 54 of the MOSFET 50. The source contact 23 is electrically connected to the gate electrode 45 of the SiCFET 40 and the source electrode 53 of the MOSFET 50. The gate contact 25 is electrically connected to the gate electrode 55 of the MOSFET 50. The drain electrode 44 of the SiCFET 40 acts as a drain contact 24 and also as a heat sink for the SiCFET 40, increasing the area for convective heat transfer, for example.

By mounting either the MOSFET on the SiCFET or the SiCFET on the MOSFET, the size of the electronic package may be reduced compared to a side-by-side arrangement. Also, the number of wire bonds 11 may be reduced, increasing reliability and reducing wire resistance of the co-packaged FET. Thus, it is preferable to mount the MOSFET and the SiCFET die-on-die to reduce the footprint of the hybrid FET. However, the side-by-side arrangement increases the surface area and thermally insulates the MOSFET from the SiCFET 40. Thus, for high temperature operation of an hybrid co-packaged FET, a side-by-side arrangement may be preferred.

Since the SiCFET may be fabricated having a much smaller dimension than the MOSFET, the SiCFET 40 may be mounted directly over a single electrode of the MOSFET 50, such as the source electrode 53, as shown in FIGS. 2A and 2B. A high power silicon carbide-silicon hybrid FET package may be produced comprising the circuit shown in FIG. 1 by making the bottom electrode 45 of the SiCFET 40 the gate electrode 45 of the SiCFET 40. In this configuration, the gate electrode 45 makes electrical contact with the source electrode 53 of the MOSFET 50. Conventionally, the bottom electrode of a SiCFET is the drain electrode; however, positioning the gate electrode on the bottom of the SiCFET with the source and drain on the opposite surface of the SiCFET 40 allows the package size to be reduced while enhancing the reliability of the device.

The SiCFET 40 has a drain gate blocking voltage in excess of the desired rating of the hybrid field effect transistor (FET) 19, 20, 21. The hybrid FET includes a SiCFET drain electrode 44, a SiCFET gate electrode 45, a SiCFET source electrode 43, a MOSFET source electrode 53, a MOSFET drain electrode 54 and a MOSFET gate electrode 55.

When the SiCFET 40 and the MOSFET 50 of this example are mounted in the configuration shown in FIGS. 2A and 2B, the SiCFET 40 is connected in cascade with the MOSFET 50. The breakdown voltage rating of the MOSFET 50 is then selected to be greater than the pinch-off voltage of the source-gate junction of the SiCFET 40.

Figure 1:
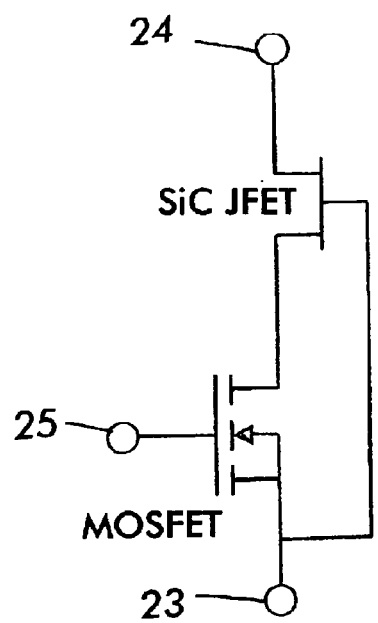
FIG. 1 shows a schematic diagram of a high power, low on-resistance circuit.

As shown in FIG. 1, the MOSFET source electrode 53 is shorted to the SiCFET gate electrode 45 and the MOSFET drain electrode 54 is shorted to the SiCFET source electrode 43. Thus, the hybrid FET has a source contact 23, a gate contact 25 and a drain contact 24 electrically connected at the MOSFET source electrode 53, the MOSFET gate electrode 55 and the SiCFET drain electrode 44, respectively.

In operation and in the blocking mode, the SiCFET 40 is normally on, allowing current to flow between the drain contact 24 to the source contact 23. When the MOSFET gate electrode is turned off, the drain bias increases and the potential across the SiCFET source 43 and SiCFET drain 44 increases until the gate-source junction pinches off. Further increases in the voltage at the source contact 23 are sustained across the drain-gate junction of the SiCFET, shielding the MOSFET from damage. When the MOSFET gate is turned on, the drain bias decreases, gate-source junction of the SiCFET opens and current flows through both the MOSFET and the SiCFET. The turn-on voltage is thus that of the series combination of the MOSFET and the SiCFET.

Although the present invention has been described in relation to particular embodiments thereof, many other variations and modifications and other uses will become apparent to those skilled in the art. It is preferred, therefore, that the present invention be limited not by the examples herein, but only by the claims themselves.

What is claimed is:

1. A hybrid field effect transistor package for use in a power circuit, comprising:

a gate contact;

a source contact;

a drain contact;

a silicon carbide semiconductor die consists of one of a junction field effect transistor and a metal semiconductor field effect transistor, the silicon carbide semiconductor die having three electrodes including a source electrode, a gate electrode and a drain electrode, each of the three electrodes being on one of a top surface and a bottom surface of the silicon carbide die and the drain electrode being electrically connected to the drain contact; and a silicon metal oxide semiconductor field effect transistor comprising a doped silicon substrate and three electrodes including a source electrodes a gate electrode and a drain electrode, each of the three electrodes being on one of an upper surface and a lower surface of the silicon transistor, the gate electrode of the silicon transistor being electrically connected to the gate contact, the drain electrode of the silicon transistor being electrically connected with the source electrode of the silicon carbide die and the source electrode of the silicon transistor being electrically connected to both the source contact and the gate electrode of the silicon carbide die;

wherein one of the three electrodes of the silicon carbide die is mounted over at least a portion of one of the three electrodes of the silicon transistor or one of the three electrodes of the silicon transistor is mounted over at least a portion of one of the three electrodes of the silicon carbide die.

2. The package of claim 1, wherein the gate electrode of the silicon carbide die is mounted on the source electrode of the silicon transistor making an electrical connection with the source electrode of the silicon transistor.

3. The package of claim 2, wherein the silicon carbide die has a periphery and the periphery of the silicon carbide die does not extend beyond an area defined by the source electrode of the silicon transistor.

4. The package of claim 1, wherein the silicon carbide die has a periphery and the drain electrode of the silicon carbide die extends beyond the periphery of the silicon carbide die, and the package further comprises an insulation layer deposited on a portion of the drain electrode of the silicon carbide die, the drain electrode of the silicon transistor being mounted on the insulation layer and over a portion of the drain electrode of the silicon carbide die.

5. The package of claim 4, wherein the drain contact is an integral portion of the drain electrode of the silicon carbide die.

6. The package of claim 4, wherein the silicon substrate has a periphery, and a portion of the drain electrode of the silicon transistor extends beyond the periphery of the silicon substrate.

7. The package of claim 6, wherein at least one wire bond electrically connects an upper surface of the portion of the drain electrode of the silicon transistor to the source electrode of the silicon carbide die.

8. The package of claim 1, wherein the source electrode of the silicon transistor is mounted on a portion of the gate electrode of the silicon carbide die and the source electrode of the silicon transistor makes an electrical connection to the gate electrode of the silicon carbide die.

9. The package of claim 8, wherein the silicon carbide die has a periphery and the drain electrode of the silicon carbide die extends beyond the periphery of the silicon carbide die.

10. The package of claim 9, wherein the drain contact is an integral portion of the drain electrode of the silicon carbide die.

11. The package of claim 1, wherein the silicon transistor has a breakdown voltage rating and the silicon carbide die has a pinch-off voltage of a source to gate junction, and the breakdown voltage rating of the silicon transistor is greater than the pinch-off voltage of the silicon carbide die.

* * * * *